United States Patent [19]

Sakai et al.

[11] Patent Number: 5,053,805
[45] Date of Patent: Oct. 1, 1991

[54] IMAGE RECORDING APPARATUS SELECTIVELY USING TWO KINDS OF PHOTOSENSITIVE RECORDING SHEETS

[75] Inventors: Jun Sakai, Nagoya; Osamu Nagata, Aichi; Keiji Seo, Nagoya, all of Japan

[73] Assignee: Brother Kogyo Kabushiki Kaisha, Aichi, Japan

[21] Appl. No.: 571,872

[22] Filed: Aug. 24, 1990

[30] Foreign Application Priority Data

Aug. 24, 1989 [JP] Japan .............................. 1-99018[U]
Oct. 30, 1989 [JP] Japan .............................. 1-282221

[51] Int. Cl.$^5$ ............................................ G03B 27/32
[52] U.S. Cl. ................................... 355/27; 355/72
[58] Field of Search ................... 355/27, 28, 100, 106, 355/72; 430/138

[56] References Cited

U.S. PATENT DOCUMENTS 4,783,683 11/1988 Nagumo et al. ...................... 355/27
4,849,792 7/1989 Horiguchi et al. .................... 355/72

*Primary Examiner*—Brian W. Brown
*Assistant Examiner*—Khanh Dang
*Attorney, Agent, or Firm*—Oliff & Berridge

[57] ABSTRACT

An image recording apparatus incorporating two sheet cartridges each storing a photosensitive recording sheet. In one example of the invention, one of the sheet cartridge stores a microcapsule sheet adapted to record a full-color iamge and the other sheet cartridge stores another kind of microcapsule sheet adapted to record a monochromatic image. When a monochromatic image recording is to be performed, the relevant microcapsule sheet is selected and conveyed past an exposure station, a developing station, and a fixing station at a speed higher than a conveying speed of the full-color image recording microcapsule sheet. In another example of the invention, one of the sheet cartridge stores a microcapsule sheet adapted to record an image of a positive film and the other sheet cartridge stores a thermally developable silver halide photosensitive sheet adapted to record an image of a negative film. The microcapsule sheet and the silver halide sheet are selectively used depending upon the nature of the original film. The film image is projected by a slide projector onto selective one of the microcapsule sheet and the silver halide sheet. An automatic image focusing adjusting mechanism automatically adjusts a focal point of the image projected by the slide projector.

20 Claims, 3 Drawing Sheets

IMAGE RECORDING APPARATUS SELECTIVELY USING TWO KINDS OF PHOTOSENSITIVE RECORDING SHEETS

BACKGROUND OF THE INVENTION

The present invention relates generally to an image recording apparatus. More particularly, the invention relates to an image recording apparatus having a plurality of sheet storage cartridges and/or cassettes in which different kinds of photosensitive recording sheets are stored or stacked.

Heretofore, there has been known an image recording apparatus in which used are a photosensitive recording sheet and a developer sheet to copy a full-color image of the original document The photosensitive recording sheet carrying on its surface an immense number of pressure rupturable microcapsules each encapsulating a chromogenic material is exposed to an imaging light, whereby the mechanical strength of the microcapsules change depending upon the light exposure and a latent image is formed thereon. The developer sheet is superposed on the photosensitive recording sheet for pressure development in which a pressure is applied to the superposed sheets to selectively rupture the weaker strength microcapsules. The chromogenic material released from the ruptured microcapsules reacts with the developer material coated on the developer sheet to thus provide a visible image on the developer sheet. According to such an apparatus, a high quality full-color copies can be obtained at inexpensive cost.

Recently, a high speed printing has been desired. However, the above-described apparatus is not satisfactory in this respect, particularly when a monochromatic image is to be copied. While it is difficult to increase the full-color copying speed due to the necessity for maintaining the sensitivity balance between yellow (Y), magenta (M), and cyan (C) microcapsules, there is a space to increase the monochromatic image copying speed because the monochromatic recording medium is highly sensitive to light. In actuality, however, in the above-described apparatus, the copying speed remains substantially the same in both cases where full-color and monochromatic copyings are performed.

There is another conventional image recording apparatus in which an image of a positive film or a negative film can be reproduced on a recording sheet. In this apparatus, a photosensitive recording sheet is placed on an exposure zone and an image of the film is projected thereonto. Two different photosensitive recording sheets need to be used which are adapted to record the images of the positive and negative films. For this reason, two types of image recording apparatuses exist, one for recording only an image of a positive film, and another for recording an image of a negative film. If these two types of apparatuses are placed in the same office, it is not desirable in terms of space and cost.

To dissolve such an inconvenience, an improved image recording apparatus (not prior art) has been proposed by the present inventors, wherein the same light source is used for recording images on two different recording sheets. Specifically, as shown in FIG. 6, there are provided a first exposure zone A where a first recording sheet adapted to record the image of the positive film is exposed to an imaging light passed through the positive film and a second exposure zone B where a second recording sheet adapted to record the image of the negative film is exposed to an imaging light passed through the negative film.

Specifically, in the arrangement shown in FIG. 6, a mirror plate 136 is placed in front of a slide projector 115 for selectively directing the imaging light onto the first and second exposure zones A, B. When a positive film is inserted into the slide projector 115, the mirror plate 136 is placed in the illustrated position and directs the imaging light passed through the positive film toward the first recording sheet. On the other hand, when a negative film is inserted thereinto, the mirror plate 136 is angularly rotated and retracted from the optical path, thereby allowing the imaging light passed through the negative film to be projected onto the second recording sheet.

However, according to such an arrangement, the provision of two exposure zones within the same recording apparatus requires two separate processing units for processing the exposed recording sheets. Such an arrangement requires a large internal space and the cost therefor increases.

SUMMARY OF THE INVENTION

The present invention has been made to solve the above-mentioned problems, and accordingly it is an object of the invention to provide an image recording apparatus capable of selectively copying monochromatic and full-color images wherein a copying speed of a monochromatic image is higher than that of a full-color image.

Another object of the invention is to provide an image recording apparatus capable of selectively copying images o positive and negative film slides with the use of a single light source.

Still another object of the invention is to provide an image recording apparatus which is compact in size and inexpensive in cost.

To achieve the above and other objects, there is provided according to one aspect of the invention an image recording apparatus for recording an image of an original document which comprises a plurality of sheet storage means, each storing a microcapsule sheet having an image recording characteristic including photosensitivity, the image recording characteristics of the microcapsule sheets being different from one another, sheet selection means for selecting one of the microcapsule sheets, exposure means for exposing the selected microcapsule sheet to an imaging light carrying the image of the original document to form a latent image thereon, the exposure means having variable exposure conditions, developing means for developing the latent image and providing a visible image on an image receiving sheet, the developing means having variable developing conditions, fixing means for fixing the visible image on the image receiving sheet, the fixing means having variable fixing conditions, conveying means for conveying the selected microcapsule sheet past the exposure means, the developing means, and the fixing means, the conveying means having variable conveying conditions, and control means for controlling at least one of the exposure condition of the exposure means, the developing condition of the developing means, the fixing condition of the fixing means, and conveying condition of the conveying means depending upon the image recording characteristic of the selected microcapsule sheet.

When, for example, the sheet selection means selects monochromatic image recording microcapsule sheet, it is conveyed by the conveying means at a speed higher than a conveying speed of the full-color image recording microcapsule sheet, whereby the monochromatic image copying can be accomplished at a higher speed relative to the full-color image copying.

According to another aspect of the invention, there is provided an image recording apparatus for recording an image of an original document, which comprises first sheet storage means for storing a first photosensitive recording sheet, second sheet storage means for storing a second photosensitive recording sheet different from the first photosensitive recording sheet, exposure means for selectively exposing the first and second photosensitive recording sheets to an imaging light carrying the image of the original document to form a latent image thereon, developing means for developing the latent image and providing a visible image on an image receiving sheet, fixing means for fixing the visible image on the image receiving means, first conveying means for conveying the first photosensitive recording sheet past the exposure means, the developing means, and the fixing means, second conveying means for conveying the second photosensitive recording sheet past the exposure means, the developing means, and the fixing means, and means for selectively activating the first and second conveying means, wherein a positive film and a negative film are used as the original document, and the first photosensitive recording sheet is used for forming a latent image corresponding to the image of the positive film and the second photosensitive recording sheet is used for forming a latent image corresponding to the image of the negative film. The exposure means comprises film projecting means for projecting the image of selective one of the positive and negative films onto selective one of the first and second photosensitive recording sheets. The exposure means further comprising an automatic image focusing adjusting mechanism for adjusting a focal point of the image projected by the film projecting means to be focused onto the selective one of the first and second photosensitive recording sheets.

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

In the following description, a photosensitive pressure-sensitive recording sheet (hereinafter simply referred to as "photosensitive recording sheet" or "microcapsule sheet") is used which has a substrate on which three kinds of pressure rupturable microcapsules are dispersedly deposited. Cyan (C), magenta (M) and yellow (Y) chromogenic materials or dye precursors are separately encapsulated in the microcapsules together with a photo-curing or photo-softening material. The three kinds of the microcapsules are different in photosensitivity depending upon the wavelength of light. For example, the microcapsules containing cyan, magenta, and yellow chromogenic materials are photo-cured or photo-softened in response to the wavelengths of 650 nm, 550 nm, 450 nm, respectively. By exposing the lights of such wavelengths onto the recording sheet in accordance with the image of the original document or slide film, a latent image corresponding to the original image is formed thereon. The recording sheet is then subjected to pressure development to rupture the microcapsules which have not photo-cured or remained softened and to react the chromogenic materials released from the ruptured microcapsules with the developer material coated on a separate developer sheet, whereby a visible image is provided on the developer sheet.

A first embodiment of the present invention will be described with reference to FIGS. 1 through 3.

Figure 1:
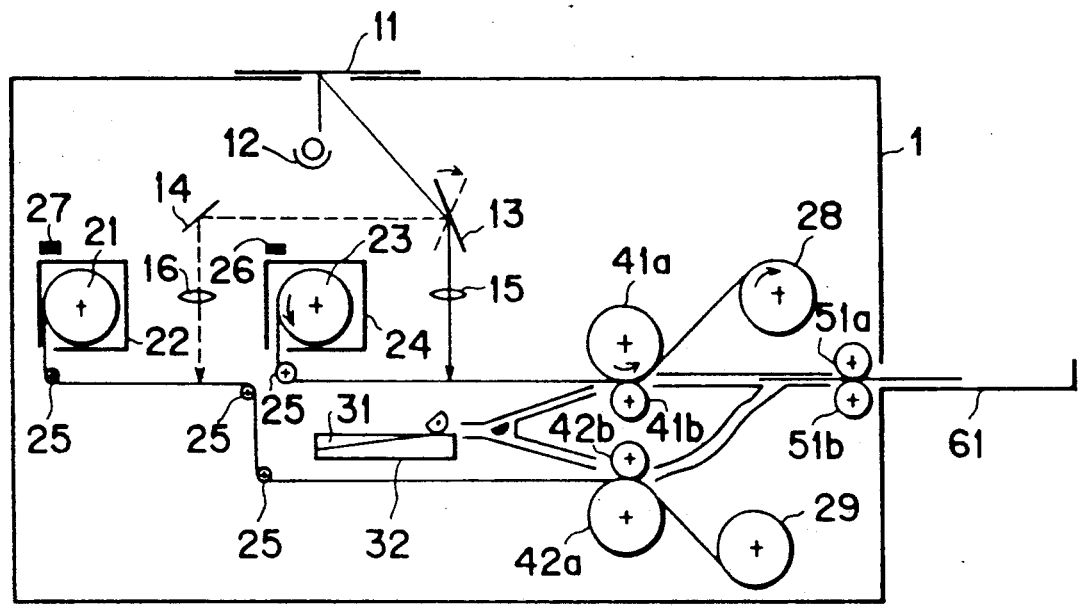
FIG. 1 is a schematic cross-sectional view showing an image recording apparatus according to one embodiment of the present invention.

FIG. 1 is a schematic cross-sectional view showing an arrangement of an image recording apparatus 1. The apparatus 1 shown therein is made up of an exposure system, a photosensitive recording sheet conveying system, a developer sheet conveying system, a pressure developing system and a thermal fixing system.

The exposure system includes an exposure lamp 12 for irradiating a light onto an original document 11, mirrors 13, 14 for changing a direction of the light reflected from the original document 11, and focusing lenses 15, 16 provided in association with the mirrors 13, 14, respectively. The mirror 13 is angularly movable between a first position and a second position. When the mirror 13 is in the first position indicated by a dotted line, the light reflected from the original document 11, i.e., imaging light, is directed toward another mirror 14, whereby the first photosensitive recording sheet 21 is exposed to the imaging light through the lens 16 to thus form a latent image corresponding to the image on the original document 11. On the other hand, when the mirror 13 is in the second position indicated by a solid line, the light reflected from the original document 11 is directed downwardly to pass through the lens 15, whereby the second photosensitive recording sheet 23 is exposed to the imaging light and hence forms a latent image corresponding to the image on the original document 11.

The photosensitive recording sheet conveying system includes a first cartridge 22 containing a roll of a first photosensitive recording sheet 21, a second cartridge 24 containing a roll of a second photosensitive recording sheet 23, feed rollers 25 provided in association with each of the first and second cartridge 22, 24, a first bar code reader 27 provided in association with the first cartridge 22, a second bar code reader 26 provided in association with the second cartridge 24, and take-up rollers 28, 29 for winding up the first and second photosensitive recording sheets 21, 23, respectively. The first and second photosensitive recording sheets 21, 23 have different photosensitivities. In this embodiment, the first photosensitive recording sheet 21 is for recording a full-color image and has a lower sensitivity to light than the second photosensitive recording sheet 23. The second photosensitive recording sheet 23 is for recording a monochromatic image and has a higher sensitivity to light than the first photosensitive recording sheet 21.

The developer sheet conveying system includes a cassette 32 in which a stack of developer sheets 31 are stored, a sector roller for feeding the uppermost developer sheet, and a sheet path change-over means for changing over the path of the developer sheet.

The pressure developing system includes a first developing unit comprising pressurizing developing rollers 42a, 42b for pressure developing the latent image on the first photosensitive recording sheet 21 and forming a visible full-color image on the developer sheet 31. The developing system further includes a second developing unit comprising pressurizing developing rollers 41a, 41b for pressure developing the latent image on the second photosensitive recording sheet 23 and forming a visible monochromatic (black-and-white) image on the developer sheet 31.

The thermal fixing system includes a thermal fixing rollers 51a, 51b for thermally fixing the image formed on the developer sheet 31. The image-formed developer sheets 31 are discharged onto a discharge tray 61.

Figure 2:
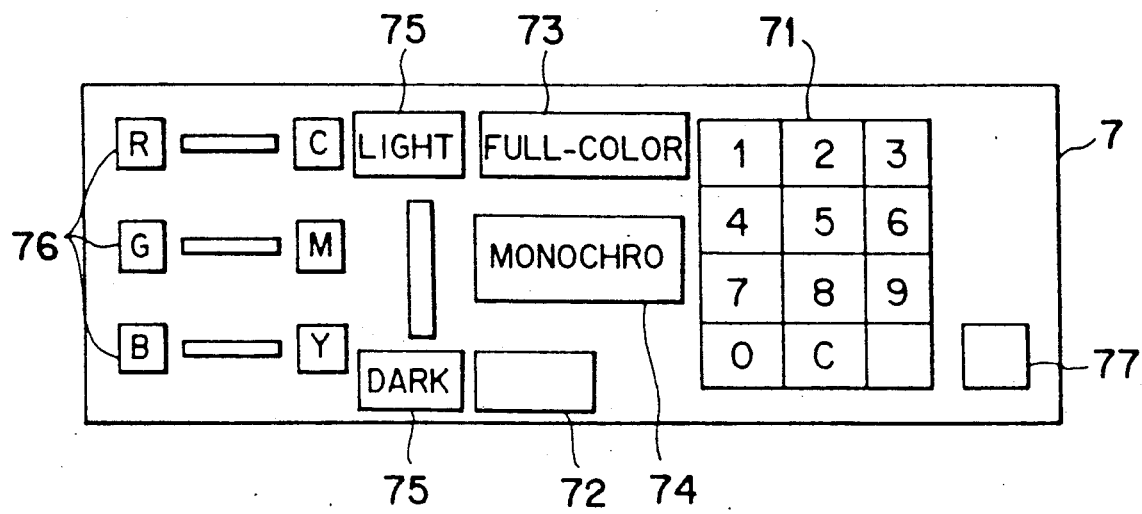
FIG. 2 is a font view showing an operation panel for controlling the image recording apparatus shown in FIG. 1.
Figure 3:
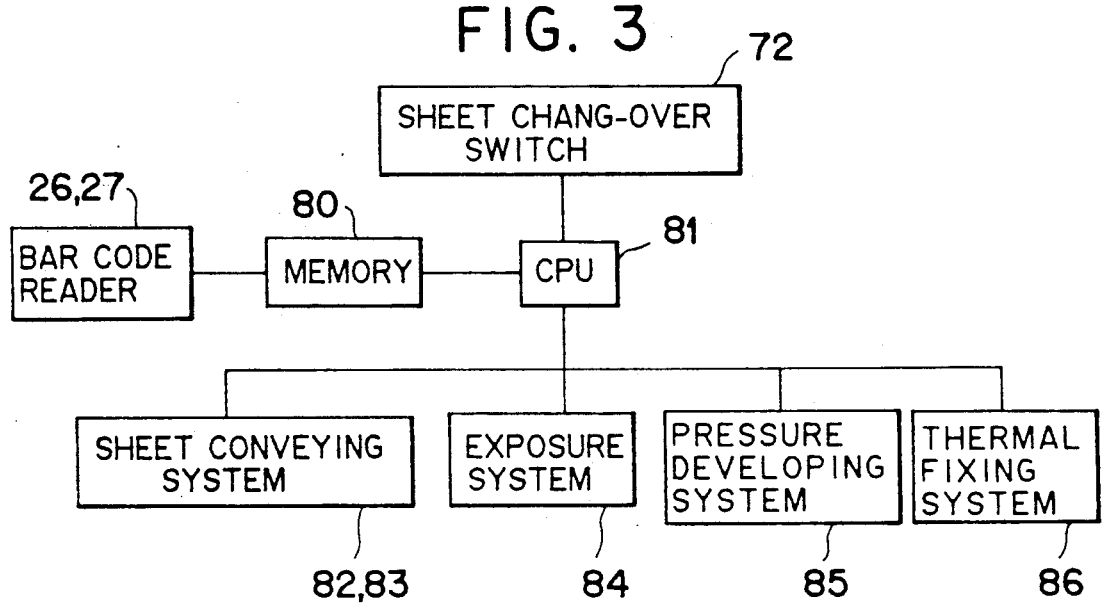
FIG. 3 is a block diagram showing a control circuit for controlling the image recording apparatus shown in FIG. 1.

FIG. 2 is a front view showing an operation panel 7 provided on the apparatus shown in FIG. 1. The operation panel 7 includes ten-key 71 for setting a number of copies, a sheet change-over key 72 for changing the kind of the photosensitive recording sheet from the first photosensitive recording sheet 21 (for full-color copying) to the second photosensitive recording sheet 23 (for monochromatic copying) or vice versa, LED lamps 73, 74 for indicating the selection of the first and second photosensitive recording sheets 21, 23, respectively, a density adjusting key 75, a tone adjusting key 76, and a start key 77.

Next, the operation of the apparatus thus arranged will be described with reference to FIG. 3.

When the first and second cartridges 22, 24 are loaded in the relevant portions of the apparatus 1, the bar code readers 27, 26 reads bar codes printed on the outer surfaces of the first and second cartridges 22, 24, respectively. The bar code indicates characteristic data of the photosensitive recording sheet accommodated in the cartridge. The data read out by the bar code readers 27, 26 are stored in a memory 80.

The first and second photosensitive recording sheets 21, 23 are withdrawn from the respective cartridges 22, 24 and extended along their own paths. Specifically, the first photosensitive recording sheet 21 is conveyed by the rollers 25 and introduced into a nip between the pressurizing developing rollers 42a, 42b, and wound around the take-up roller 29. The second photosensitive recording sheet 23 is conveyed by another roller 25 and introduced into a nip between the pressurizing developing rollers 41a, 41b and wound around the take-up roller 28. This completes an initial setting of the apparatus 1 and allows start of the copying operation. At this time, the exposure system 84, photosensitive recording sheet conveying system 82, developer sheet conveying system 83, pressure developing system 85 and thermal fixing system 86 have been set to operate in accordance with the characteristic data of either the first or second photosensitive recording sheets 21, 23 whichever it is specified by the sheet change-over key 72. As described, the characteristic data of the first and the second photosensitive recording sheets have been read out by the associated bar code readers 27, 26.

Description will now be made with respect to the case where the full-color copying mode is specified by the key 72. The copying operation starts upon the depression of the start key 77. The light emanated from the exposure lamp 12 is irradiated onto the original document 11 and the light reflected therefrom, i.e., imaging light, is reflected on the mirrors 13, 14 and enters the focusing lens 16, whereby the first photosensitive recording sheet 21 is exposed to the imaging light and a full-color latent image is formed thereon. The first photosensitive recording sheet 21 is conveyed and introduced into the nip between the pressurizing developing rollers 42a, 42b. In synchronism with the conveyance of the first photosensitive recording sheet 21, the developer sheet 31 is fed out from the cassette 32 so that the developer sheet 31 is brought to facial contact with the latent image formed portion of the first photosensitive recording sheet 21. The superposed two sheets 21, 31 are applied with pressure by means of the rollers 42a, 42b. As a result, a visible color image is formed on the developer sheet 31. The image-formed developer sheet 31 is introduced into the thermal fixing system 86 comprising the thermal fixing rollers 51a, 51b where the image formed thereon is thermally fixed. The developer sheet 31 is then discharged onto the discharge tray 61. The exhausted first photosensitive recording sheet 21 is wound around the take-up roller 29. This completes the full-color copying operation.

Next, description will be made with respect to the case where the monochromatic image recording is to be performed.

The sheet change-over switch 72 provided on the operation panel 7 is depressed to change the photosensitive recording sheet to be used, i.e., from the first to the second photosensitive recording sheet. In response to the depression of the switch 72, the LED lamp 74 is lit to indicate the selection of the monochromatic o second photosensitive recording sheet 23.

In response to the depression of the switch 72, the characteristic data of the second photosensitive recording sheet 23 stored in the memory 80 is fetched and transferred to a central processing unit (CPU) 81, whereupon the exposure system 84, photosensitive recording sheet conveying system 82, developer sheet conveying system 83, pressure developing system 85 and thermal fixing system 86 are set to process the second photosensitive recording sheet 23. More specifically, in the exposure system 84, the mirror 13 is angularly rotated to direct the imaging light downwardly so that the second photosensitive recording sheet 23 is exposed to the imaging light through the focusing lens 15. In the conveying system 82, the conveying speed of the second photosensitive recording sheet 23 is changed to be higher than that of the first photosensitive recording sheet 21. Further, the conveying path for the developer sheet 31 is changed so that the latter is introduced into the nip between the pressurizing developer rollers 41a, 41b. The pressure imparted by the rollers 41a, 41b is also changed to be higher than the case of developing the latent image on the first photosensitive recording sheet 21. In the thermal fixing system 86, the temperature of the rollers 51a, 51b is set to be higher than the case of thermally fixing the reproduced full-color image, as the conveying speed of the developer sheet 31 is increased.

As described, according to the first embodiment of the invention, upon completion of the mode setting and depression of the start switch, the monochromatic image reproduction is carried out in the same manner as in the case of reproducing a full-color image but with a higher copying speed.

A second embodiment of the present invention will be described with reference to FIGS. 4 and 5.

Figure 4:
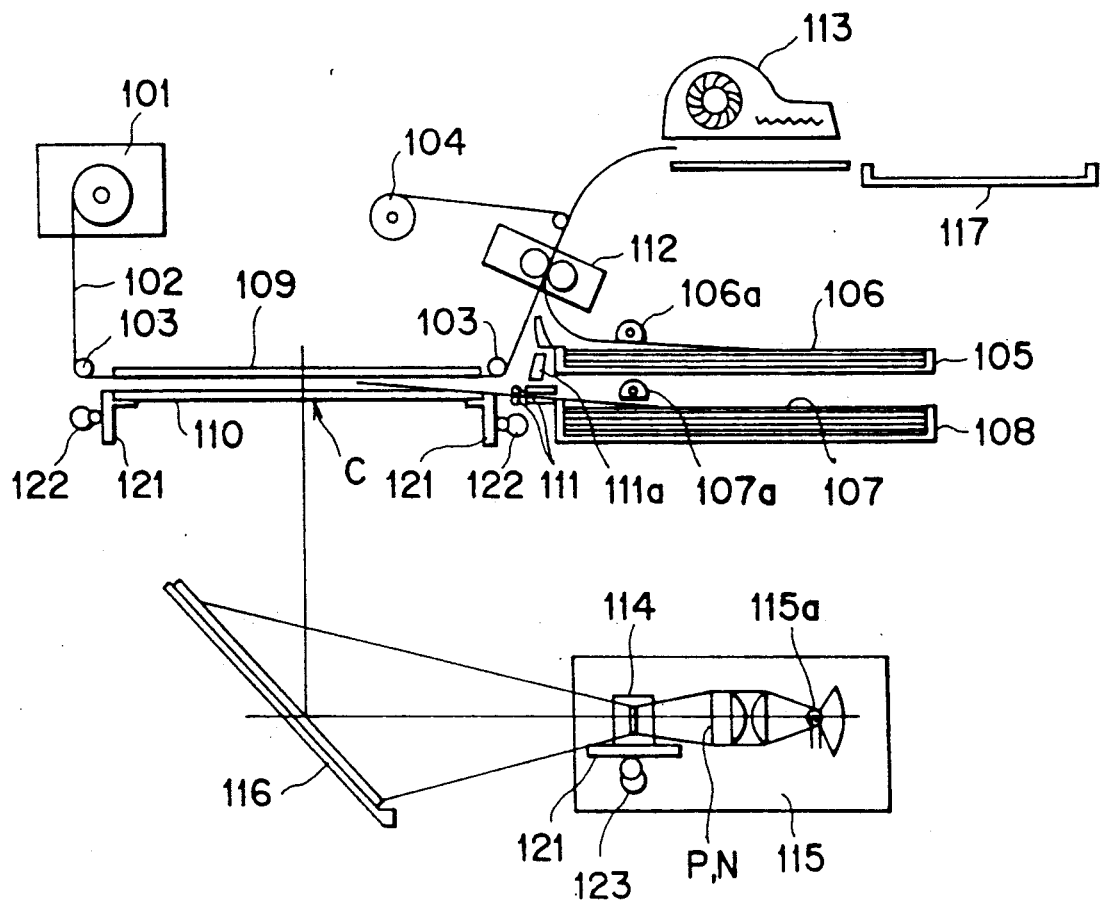
FIG. 4 is a schematic cross-sectional view showing an image recording apparatus according to another embodiment of the present invention.

FIG. 4 is a schematic cross-sectional view showing an image recording apparatus according to the second embodiment of the invention. The apparatus employs a slide projector 115 and records an image projected thereby on an image recording sheet. The image projector 115 is disposed in the lower portion of the recording apparatus and includes a focusing lens 114 having an image focusing adjusting mechanism 123 (to be described in detail with reference to FIG. 5). In the second embodiment, original images on both positive and negative films can be distinctly copied on the recording sheet. An elongated, web-like photosensitive recording sheet 102 (hereinafter referred to as "microcapsule sheet") is used to record the image of the positive film while a thermally developable silver halide photosensitive sheet (known as a dry silver sheet (trade name) and hereinafter referred to as "silver halide sheet") in the form of a cut sheet is used to record the image of the negative film.

A mirror plate 116 is disposed in front of the slide projector, which is inclined about 45 degrees so that the imaging light emanating from the slide projector 115 is directed upwardly. Above the mirror plate 116, there is provided an exposure station C where an exposure plate 109 is disposed. The exposure plate 109 serves not only to support the microcapsule sheet 102 when the latter is exposed to the imaging light but also to guide the conveyance of the microcapsule sheet 102. In the left upper portion of the exposure station C, a cassette 101 is disposed in which a rolled microcapsule sheet 102 is accommodated. The microcapsule sheet 102 withdrawn from an opening (not shown) of the cassette 101 is conveyed along the exposure plate 109 by a pair of feed rollers 103 disposed in both sides of the exposure plate 109. A glass plate 110 for supporting the silver halide sheet 107 is disposed below the exposure plate 109 in substantially parallel to the exposure plate 109. The glass plate 110 is moved toward and away from the exposure plate 109 by means of a glass plate moving mechanism 22 (to be described in detail with reference to FIG. 5).

A developer sheet cassette 105 and a silver halide sheet cassette 108 are vertically arranged rightwardly of the exposure station C. In the developer sheet cassette 105, a sector roller 106a is provided for feeding the uppermost developer sheet 106. Likewise, in the silver halide sheet cassette 108, a sector roller 107a is provided for feeding the uppermost silver halide sheet 107. A pair of feed rollers 111 are disposed leftwardly of the cassette 108 for feeding the silver halide sheet 107 toward the exposure station C. Above the feed rollers 111, a sheet guide member 111a is vertically movably disposed so that the silver halide sheet 107 which has been exposed to the imaging light in the exposure station C is transported toward a pressure developing station 112.

The pressure developing station 112 is disposed above the sheet guide member 111a, into which the microcapsule sheet 102 and the developer sheet 106 are introduced in superposed state. After the pressure development, the microcapsule sheet 102 is wound around a take-up roller 104 disposed in the outlet side of the pressure developing station 112. The developer sheet 106 is introduced into a thermal fixing station 113 provided above the pressure developing station 112 and is then discharged onto a discharge tray 117.

Figure 5:
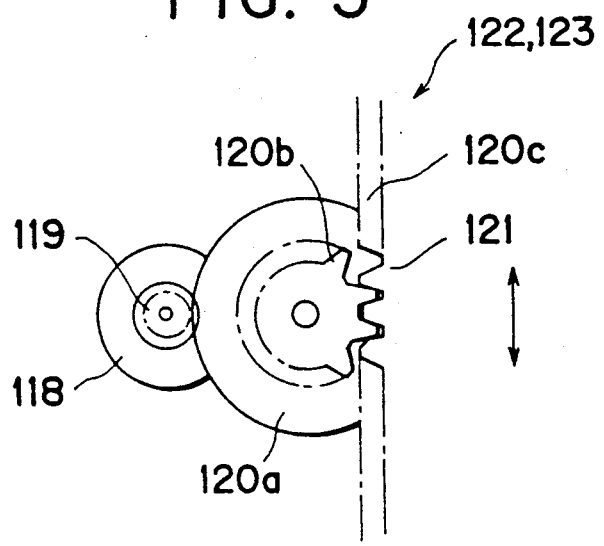
FIG. 5 is a partial enlarged diagram showing a part of the apparatus shown in FIG. 4.

FIG. 5 is an enlarged cross-sectional view showing each of the glass plate moving mechanism 122 and the image focusing adjusting mechanism 123. For the glass plate moving mechanism 122, reference numeral 121 denotes each of two side guides provided in both sides of the glass plate 122. For the image focusing adjusting mechanism 123, the same reference numeral denotes a guide of the lens 114. In the longitudinal direction of the guide 121, a rack 120c is formed which is meshingly engaged with a pinion gear 120b formed on a small-diameter base circle. A speed reduction gear 120a is coaxially provided with respect to the pinion gear 120b and is integrally rotatable therewith. With the speed reduction gear 120a, threadingly engaged is a drive gear 119 attached to the drive shaft of a drive motor 118. Therefore, when the drive motor 118 rotates in the clockwise or counterclockwise direction, the guide 121 moves upwardly or downwardly in FIG. 5 through the drive gear 119, the speed reduction gear 120a, and the pinion gear 120b.

Next, operation for forming an enlarged image of an original image on a positive film P will be described.

Firstly, the positive film P is inserted in the film insertion position in the slide projector 115, whereupon the microcapsule sheet 102 is unrolled from the cassette 101 and is extended to a position beneath the exposure plate 109 by means of the feed rollers 103. Thereafter, light emitted from the light source 115a is irradiated onto the positive film P and the image of the positive film P is enlarged by the lens 114. The enlarged image is reflected upon the mirror plate 116 and projected onto the microcapsule sheet 102. At this time, the image focusing adjusting mechanism 123 is controlled so that the image projected thereonto is in-focus. The microcapsule sheet 102 which has been exposed to the imaging light is again conveyed by the feed rollers 103 to be introduced into the pressure developing station 112 where the microcapsule sheet 102 and the developer sheet 106 are subjected to pressure development. In the pressure developing station 112, the latent image formed on the microcapsule sheet 102 is developed and a visible image is formed on the developer sheet 106. The visible image formed developer sheet 107 is fed into the thermal fixing station 1133 for thermally fixing the image, and is then discharged onto the discharge tray 117. On the other hand, the used microcapsule sheet 102 is wound up around the take-up roller 104.

Next, operation for forming an enlarged image corresponding to the image on a negative film N will be described.

The negative film N is inserted into the film insertion position of the slide projector 115. Then, the silver halide sheet supporting glass plate 110 is downwardly moved by means of the moving mechanism 122. In this condition, the sector roller 107a is rotated to feed the uppermost silver halide sheet 107 toward the exposure station C. The silver halide sheet 107 is fed into a space between the microcapsule sheet 102 and the glass plate 110 by means of the feed rollers 111. Thereafter, the edge portion of the silver halide sheet 107 is grasped by the feed rollers 111. Under this condition, the glass plate 110 is upwardly moved toward the exposure plate 109, whereby the silver halide sheet 107 is brought into intimate contact with the microcapsule sheet 102.

The image of the negative film N projected onto the silver halide sheet 107 through the mirror plate 116 is enlarged by the lens 114. The enlarged image projected onto the silver halide sheet 107 is in-focus thereon through the adjustment of the focal point by the image focusing adjusting mechanism 123. The silver halide sheet 107 thus exposed to the imaging light is separated from the microcapsule sheet 102 by downwardly moving the glass plate 110 by means of the glass plate moving mechanism 122. Upon lowering the sheet guide member 111a, the feed rollers 111 are reversely rotated for feeding the silver halide sheet 107 toward the pressure developing station 112. Due to the downwardly moved sheet guide member 111a, the silver halide sheet 107 is prevented from being returned to the cassette 108.

The rollers in the pressure developing station 112 have been held out of contact with each other and allow the silver halide sheet 107 to be directly introduced into the thermal fixing station 113 where the same is subjected to thermal development. After completion of the thermal development, the silver halide sheet 107 is discharged onto the discharge tray 117.

It is preferred that the base of the silver halide sheet 107 be painted black so that the microcapsule sheet 102 disposed above the silver halide sheet 107 may not be exposed to light.

Figure 6:
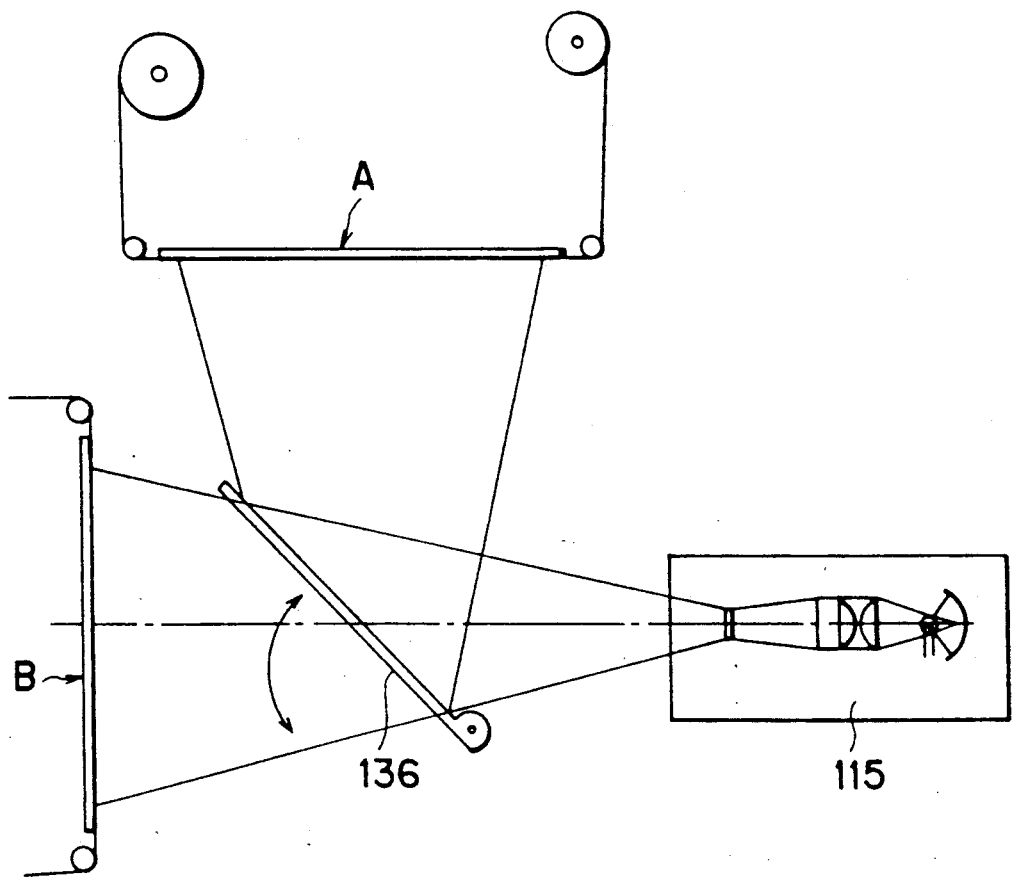
FIG. 6 is a schematic cross-sectional view showing an image recording apparatus provided with a plurality of optical axes.

In the second embodiment, two kinds of photosensitive recording sheets are used, one being the microcapsule sheet 102 which is in an elongated, web-like form and the other being a silver halide sheet 107 which is in a cut sheet form. It is to be noted that this combination is desirable for the reasons set forth below. If two kinds of sheets are both in the form of cut sheet, when one of the sheets is exposed to light, the remaining sheet cannot be stayed in unaffected state. A space for receiving the unused sheets needs to be provided. In addition, there arises a difficulty in separating or peeling off the intimately contacted cut sheets after the pressure development. On the other hand, when two kinds of sheets are both in the form of elongated sheets, it is incapable of selectively exposing the two sheets if it is intended to perform exposure on the same optical axis. Because one of the sheet interrupts the light exposure with respect to the remaining sheet. To solve this problem, it is necessary that two separate optical paths be provided for allowing to selectively expose the two sheets to light. The arrangement of the optical path as shown in FIG. 6 is not desirable in terms of internal space and cost of the apparatus.

While in the second embodiment of the invention, although two cassettes separately storing the developer sheets and the silver halide sheets are provided, one can be dispensed with. In such a case, a sheet path changeover means needs to be provided so that the sheet can be selectively fed toward the feed rollers 111 and the pressure developing station 112. The developer sheets 106 and the silver halide sheets 107 may be replaced from one to the other depending upon the mode of operation to be performed.

According to the second embodiment of the invention, it is advantageous in that the apparatus can be made in compact size and the manufacturing cost of the apparatus can be reduced to a greater extent in comparison with the conventional apparatus.

What is claimed is:

1. An image recording apparatus for recording an image of an original document, comprising:
   a plurality of sheet storage means, each storing a photosensitive recording sheet having an image recording characteristic including photosensitivity, the image recording characteristics of the photosensitive recording sheets being different from one another;
   sheet selection means for selecting one of the photosensitive recording sheets;
   exposure means for exposing the selected photosensitive recording sheet to an imaging light carrying the image of the original document to form a latent image thereon, said exposure means having variable exposure conditions;
   developing means for developing the latent image and providing a visible image on an image receiving sheet, said developing means having variable developing conditions;
   fixing means for fixing the visible image on the image receiving sheet, said fixing means having variable fixing conditions;
   conveying means for conveying the selected photosensitive recording sheet past said exposure means, said developing means, and said fixing means, said conveying means having variable conveying conditions; and
   control means for controlling at least one of the exposure condition of said exposure means, the developing condition of said developing means, the fixing condition of said fixing means, and conveying condition of said conveying means depending upon the image recording characteristic of the selected photosensitive recording sheet.

2. An image recording apparatus according to claim 1, wherein one of the photosensitive recording sheets is used for recording a full-color image and another one of the photosensitive recording sheets is used for recording a monochromatic image.

3. An image recording apparatus according to claim 2, wherein said control means controls said conveying means so that a conveying speed of the monochromatic image recording photosensitive recording sheet is faster than that of the full-color image recording photosensitive recording sheet.

4. An image recording apparatus according to claim 3, wherein the monochromatic image recording photosensitive recording sheet has a higher photosensitivity than the full-color image recording photosensitive recording sheet 5. An image recording apparatus according to claim 4, wherein each of the full-color and the monochromatic image recording photosensitive recording sheets has a surface coated with an immense number of pressure rupturable microcapsules each encapsulating a chromogenic material therein, and wherein the image receiving sheet has a surface coated with a developer material which reacts with the chromogenic material.

6. An image recording apparatus according to claim 5, wherein said developing means includes at least two pressure developing units, one of the pressure developing units being used for pressure developing the full-color image recording photosensitive recording sheet and another one of the pressure developing units being used for pressure developing the monochromatic image recording photosensitive recording sheet, and wherein said control means controls the conveying means so that selected one of the full-color and the monochromatic image recording photosensitive recording sheets is conveyed past the relevant pressure developing unit.

7. An image recording apparatus according to claim 6, wherein said fixing means thermally fixes the visible image, and wherein said control means controls said fixing means so that a monochromatic visible image is thermally fixed at a temperature higher than a temperature at which a full-color visible image is thermally fixed.

8. An image recording apparatus for recording an image of an original document, comprising:

first sheet storage means for storing a first photosensitive recording sheet;

second sheet storage means for storing a second photosensitive recording sheet different from the first photosensitive recording sheet;

exposure means for selectively exposing the first and second photosensitive recording sheets to an imaging light carrying the image of the original document to form a latent image thereon;

developing means for developing the latent image and providing a visible image on an image receiving sheet;

fixing means for fixing the visible image on the image receiving means;

first conveying means for conveying the first photosensitive recording sheet past said exposure means, said developing means, and said fixing means;

second conveying means for conveying the second photosensitive recording sheet past said exposure means, said developing means, and said fixing means; and means for selectively activating said first and second conveying means, wherein a positive film and a negative film are used as the original document, and the first photosensitive recording sheet is used for forming a latent image corresponding to the image of the positive film and the second photosensitive recording sheet is used for forming a latent image corresponding to the image of the negative film, and wherein said exposure means comprises film projecting means for projecting the image of selective one of the positive and negative films onto selective one of the first and second photosensitive recording sheets.

9. An image recording apparatus according to claim 8, wherein the first photosensitive recording sheet is used for recording a full-color image and the second photosensitive recording sheet is used for recording a monochromatic image.

10. An image recording apparatus according to claim 9, wherein when said second conveying means is activated, said second conveying means conveys the second photosensitive recording sheet at a speed faster than a conveying speed of the first photosensitive recording sheet by said first conveying means.

11. An image recording apparatus according to claim 10, wherein each of the first and second photosensitive recording sheets is in the form of an elongated, web-like sheet and is stored in the respective sheet storage means in a rolled state, and wherein the image receiving sheet is in the form of a cut sheet.

12. An image recording apparatus according to claim 10, wherein the second photosensitive recording sheet has a higher photosensitivity than the first photosensitive recording sheet.

13. An image recording apparatus according to claim 8, wherein exposures onto the first and second photosensitive recording sheets are taken place at different positions.

14. An image recording apparatus according to claim 12, wherein each of the first and second photosensitive recording sheets has a surface coated with an immense number of pressure rupturable microcapsules each encapsulating a chromogenic material therein, and wherein the image receiving sheet has a surface coated with a developer material which reacts with the chromogenic material.

15. An image recording apparatus according to claim 8, wherein said exposure means further comprising an automatic image focusing adjusting mechanism for adjusting a focal point of the image projected by said film projecting means to be focused onto the selective one of the first and second photosensitive recording sheets.

16. An image recording apparatus according to claim 15, wherein the first photosensitive recording sheet is in the form of an elongated, web-like sheet and is stored in said first sheet storage means, and wherein the second photosensitive recording sheet is in the form of a cut sheet and stacked in said second sheet storage means.

17. An image recording apparatus according to claim 16, wherein exposure onto the first and second photosensitive recording sheets are taken place substantially at the same position.

18. An image recording apparatus according to claim 17, wherein the first photosensitive recording sheet has a surface coated with an immense number of pressure rupturable microcapsules encapsulating a chromogenic material therein.

19. An image recording apparatus according to claim 17, wherein the second photosensitive recording sheet is a thermally developable silver halide sheet.

20. An image recording apparatus for recording an image of an original document, comprising:

first sheet storage means for storing a first photosensitive recording sheet;

second sheet storage means for storing a second photosensitive recording sheet different from the photosensitive recording sheet;

exposure means for selectively exposing the first and second photosensitive recording sheets to an imaging light carrying the image of the original document to form a latent image thereon;

developing means for developing the latent image and providing a visible image on an image receiving sheet;

fixing means for fixing the visible image on the image receiving means;

first conveying means for conveying the first photosensitive recording sheet past said exposure means, said developing means, and said fixing means;

second conveying means for conveying the second photosensitive recording sheet past said exposure means, said developing means, and said fixing means; and means for selectively activating said first and second conveying means;

wherein exposures onto the first and second photosensitive recording sheets are taken at different positions.

* * * * *